(12) United States Patent
Lee et al.

(10) Patent No.: US 11,379,067 B2
(45) Date of Patent: *Jul. 5, 2022

(54) TOUCH SENSOR AND DISPLAY DEVICE INCLUDING THE SAME

(71) Applicant: SAMSUNG DISPLAY CO., LTD., Yongin-si (KR)

(72) Inventors: Kyung Su Lee, Suwon-si (KR); Jong Hwa Kim, Yongin-si (KR); Duck Joong Kim, Busan (KR); Il Joo Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/223,219

(22) Filed: Apr. 6, 2021

(65) Prior Publication Data

US 2021/0223899 A1 Jul. 22, 2021

Related U.S. Application Data

(63) Continuation of application No. 16/592,272, filed on Oct. 3, 2019, now Pat. No. 10,976,849.

(30) Foreign Application Priority Data

Oct. 8, 2018 (KR) .................. 10-2018-0120076

(51) Int. Cl.
*G06F 3/041* (2006.01)
*H01L 51/50* (2006.01)
*G06F 3/044* (2006.01)

(52) U.S. Cl.
CPC ............ *G06F 3/0412* (2013.01); *G06F 3/044* (2013.01); *G06F 3/04164* (2019.05); *H01L 51/5012* (2013.01); *G06F 2203/04103* (2013.01)

(58) Field of Classification Search
CPC .... G06F 3/0412; G06F 3/04164; G06F 3/044; H01L 51/5012

(Continued)

(56) References Cited

U.S. PATENT DOCUMENTS 6,757,002 B1 6/2004 Oross et al.
10,534,470 B2 1/2020 Lin
(Continued)

FOREIGN PATENT DOCUMENTS

CN 108241455 A 7/2018
KR 10-2017-0112464 10/2017
(Continued)

OTHER PUBLICATIONS

Notice of Allowance dated Dec. 9, 2020 In Corresponding U.S. Appl. No. 16/592,272.
(Continued)

*Primary Examiner* — Prabodh M Dharia
(74) *Attorney, Agent, or Firm* — F. Chau & Associates, LLC

(57) ABSTRACT

A touch sensor includes first through third sensing areas, first through third sensing patterns respectively disposed in the first through third sensing areas, a sensing line disposed in a non-sensing area and electrically connected to the first sensing pattern, and a connection line disposed in the non-sensing area and disposed between the sensing line and the first sensing pattern. The connection line electrically connects the second and third sensing patterns. The touch sensor further includes a connection portion electrically connecting the sensing line and the first sensing pattern, a dummy line disposed between the sensing line and the connection line, a ground line disposed in the non-sensing area that transmits a ground voltage to the first to third (Continued)

sensing areas, and a bridge line electrically connecting the ground line and the dummy line.

20 Claims, 12 Drawing Sheets

(58) Field of Classification Search
USPC .......................................................... 345/173
See application file for complete search history.

(56) References Cited

U.S. PATENT DOCUMENTS

| | | |
|---|---|---|
| 2011/0048812 A1 | 3/2011 | Yilmaz |
| 2016/0034742 A1 | 2/2016 | Kim et al. |
| 2016/0062537 A1 | 3/2016 | Kim et al. |
| 2016/0170513 A1 | 6/2016 | Lee et al. |
| 2016/0179229 A1 | 6/2016 | Ahn |
| 2016/0283031 A1 | 9/2016 | Hwang et al. |
| 2018/0232092 A1* | 8/2018 | Lee ....................... G06F 3/0412 |
| 2018/0373359 A1 | 12/2018 | Han et al. |
| 2019/0056819 A1* | 2/2019 | Moon ..................... G06F 3/044 |
| 2020/0110499 A1 | 4/2020 | Lee et al. |

FOREIGN PATENT DOCUMENTS

| | | |
|---|---|---|
| KR | 10-2019-0020213 | 2/2019 |
| KR | 10-2019-0098295 | 8/2019 |

OTHER PUBLICATIONS

Office Action dated Jul. 13, 2020 In Corresponding U.S. Appl. No. 16/592,272.

* cited by examiner

TOUCH SENSOR AND DISPLAY DEVICE INCLUDING THE SAME

CROSS-REFERENCE TO RELATED APPLICATIONS

This application is a continuation of U.S. patent application Ser. No. 16/592,272 filed Oct. 3, 2019, which claims priority under 35 U.S.C. § 119 to Korean Patent Application No. 10-2018-0120076, filed on Oct. 8, 2018, the disclosure of which is incorporated by reference herein in its entirety.

TECHNICAL FIELD

Exemplary embodiments of the present invention relate to a touch sensor having improved reliability and a display device including the same.

DISCUSSION OF THE RELATED ART

A display device is a device for displaying an image, and typically includes a display member such as an organic light emitting display member or a liquid crystal display member. The display member may include a display layer including a plurality of pixels and a touch sensing layer performing a touch sensing function.

An active area of the display device may have, for example, a square shape, a circular shape, or a trench-shaped irregular shape. The display device displays an image through the active area having various shapes and areas, and may detect whether a touch input is generated. Various types of line designs may be required due to the active area having an irregular shape.

SUMMARY

Exemplary embodiments of the present invention provide a touch sensor having improved reliability and an improved display device by proposing various line designs of the display device.

According to an exemplary embodiment, a touch sensor includes a base layer having a sensing area and a non-sensing area disposed adjacent to the sensing area. The sensing area includes a first sensing area, second sensing area protruding from the first sensing area in a first direction, and a third sensing area spaced apart from the second sensing area and protruding from the first sensing area in the first direction. The touch sensor further includes a plurality of sensing patterns including a first sensing pattern disposed in the first sensing area, a second sensing pattern disposed in the second sensing area, and a third sensing pattern disposed in the third sensing area. The touch sensor further includes a sensing line disposed in the non-sensing area and electrically connected to the first sensing pattern, and a connection line disposed in the non-sensing area and disposed between the sensing line and the first sensing pattern. The connection line electrically connects the second sensing pattern and the third sensing pattern. The touch sensor further includes a connection portion electrically connecting the sensing line and the first sensing pattern, a dummy line disposed between the sensing line and the connection line, and a ground line disposed in the non-sensing area. The ground line transmits a ground voltage to the first to third sensing areas. The touch sensor further includes a bridge line electrically connecting the ground line and the dummy line.

In an exemplary embodiment, the touch sensor includes an insulating layer. The dummy line and the ground line are formed of a first conductive layer, the bridge line is formed of a second conductive layer, and the insulating layer is disposed between the first conductive layer and the second conductive layer.

In an exemplary embodiment, the touch sensor includes a contact hole passing through the insulating layer. The ground line and the dummy line are electrically connected to the bridge line through the contact hole.

In an exemplary embodiment, the sensing line is formed of the first conductive layer.

In an exemplary embodiment, the connection portion is formed of the second conductive layer.

In an exemplary embodiment, the touch sensor includes a contact hole passing through the insulating layer. The connection portion is electrically connected to the sensing line through the contact hole.

In an exemplary embodiment, the ground line and the dummy line extend in a second direction crossing the first direction, and the bridge line extends in the first direction.

In an exemplary embodiment, the bridge line includes a first bridge line and a second bridge line. The first bridge line and the second bridge line are symmetrically disposed relative to the connection portion.

In an exemplary embodiment, the dummy line includes a first dummy line and a second dummy line. The first dummy line is electrically connected to the first bridge line and the second bridge line. The second dummy line includes a first segment and a second segment physically separated from the first segment. The first segment is electrically connected to the first bridge line, and the second segment is electrically connected to the second bridge line.

In an exemplary embodiment, the first and second dummy lines are integrally formed.

In an exemplary embodiment, the dummy line further includes a third dummy line disposed between the connection line and the first sensing pattern.

In an exemplary embodiment, the bridge line electrically connects the ground line and the first to third dummy lines.

In an exemplary embodiment, an area of the first sensing area is larger than an area of the second and third sensing areas.

In an exemplary embodiment, the bridge line includes a transparent conductive oxide.

According to an exemplary embodiment, a display device includes a display member that displays an image, and a base layer having a sensing area and a non-sensing area disposed adjacent to the sensing area. The sensing area includes a first sensing area, a second sensing area protruding from the first sensing area in a first direction, and a third sensing area spaced apart from the second sensing area and protruding from the first sensing area in the first direction. The display device further includes a first sensing electrode including a plurality of first sensing patterns disposed in the sensing area. The first sensing patterns are arranged in the first direction and are electrically connected to each other. The display device further includes a second sensing electrode including a plurality of second sensing patterns disposed in the first sensing area. The second sensing patterns are arranged in a second direction crossing the first direction and are electrically connected to each other. The display device further includes a third sensing electrode including a first plurality of third sensing patterns disposed in the second sensing area, arranged in the second direction, and electrically connected to each other, and a second plurality of third sensing patterns disposed in the third sensing area, arranged in the second direction, and electrically connected to each other. The display device further includes a first sensing line electrically connected to one end of the first sensing electrode, a second sensing line electrically connected to one end of the second sensing electrode, and a connection line electrically connecting the first plurality of third sensing patterns and the second plurality of third sensing patterns. The connection line is disposed between the first sensing line and the first sensing electrode. The display device further includes a connection portion electrically connecting the first sensing line and the first sensing patterns, a dummy line disposed between the first sensing line and the connection line, and a ground line disposed in the non-sensing area. The ground line transmits a ground voltage to the first to third sensing areas. The display device further includes a bridge line electrically connecting the ground line and the dummy line.

In an exemplary embodiment, the display device includes an insulating layer. The dummy line and the ground line are formed of a first conductive layer, the bridge line is formed of a second conductive layer, and the insulating layer is disposed between the first conductive layer and the second conductive layer.

In an exemplary embodiment, the display device includes a contact hole passing through the insulating layer. The ground line and the dummy line are electrically connected to the bridge line through the contact hole.

In an exemplary embodiment, the ground line and the dummy line extend in the second direction, and the bridge line extends in the first direction.

In an exemplary embodiment, the bridge line includes a first bridge line and a second bridge line, and the first bridge line and the second bridge line are symmetrically disposed relative to the connection portion.

In an exemplary embodiment, the dummy line includes a first dummy line and a second dummy line, the first dummy line is electrically connected to the first bridge line and the second bridge line, and the second dummy line includes a first segment and a second segment physically separated from the first segment. The first segment is electrically connected to the first bridge line, and the second segment is electrically connected to the second bridge line.

BRIEF DESCRIPTION OF THE DRAWINGS

The above and other aspects and features of the present invention will become more apparent by describing in detail exemplary embodiments thereof with reference to the accompanying drawings, in which.

DETAILED DESCRIPTION OF THE EXEMPLARY EMBODIMENTS

Figure 1:
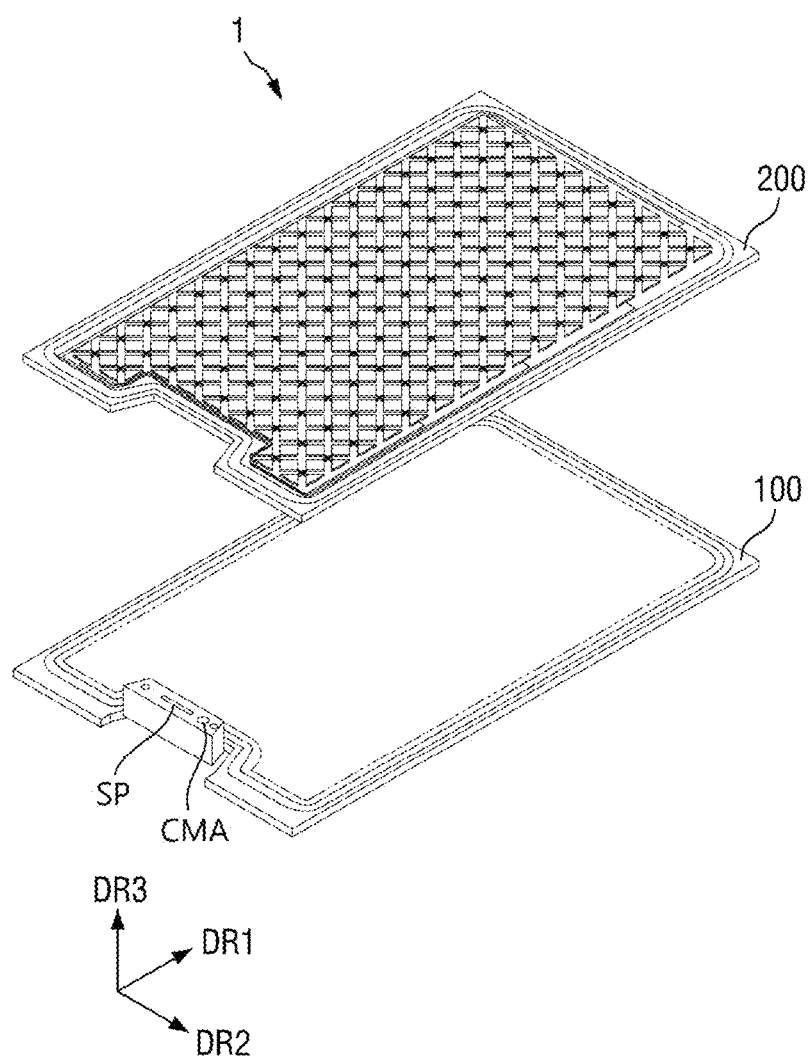
FIG. 1 is an exploded perspective view illustrating a display device including a touch sensor according to an exemplary embodiment.

Exemplary embodiments of the present invention will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

In the following description, the first direction DR1 means any direction in the plane, and the second direction DR2 means another direction intersecting the first direction DR1 in the plane. In addition, the third direction DR3 means a direction substantially perpendicular to the plane.

Unless otherwise defined herein, 'plane' means the plane to which the first direction DR1 and the second direction DR2 belong. In addition, unless otherwise defined, 'overlap' means overlap in the third direction DR3 at the plane view.

Figure 2:
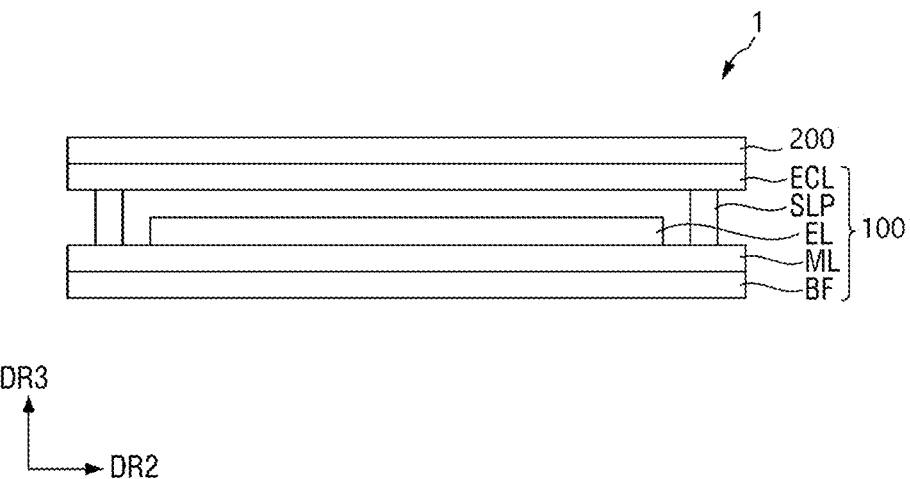
FIG. 2 is a schematic cross-sectional view of a display device according to an exemplary embodiment.

FIG. 1 is an exploded perspective view illustrating a display device including a touch sensor according to an exemplary embodiment. FIG. 2 is a schematic cross-sectional view of the display device of FIG. 1.

Referring to FIGS. 1 and 2, a display device 1 according to an exemplary embodiment may include a display member 100 and a touch sensing layer 200.

The display member 100 may include a speaker SP and a camera module CMA. The speaker SP and the camera module CMA are arranged to overlap with a non-display area to be described below, and may not overlap with the display area.

The display member 100 is a member that displays an image by an inputted data signal. The display member 100 may be implemented with, for example, an organic light emitting display member, a liquid crystal display member, a plasma display member, an electrophoretic display member, an electrowetting display member, a quantum dot light emitting display member, a micro light emitting diode (LED) display member, etc. In the illustrated exemplary embodiment, the display member 100 is an organic light emitting display member. However, the present invention is not limited thereto.

The display member 100 may include a base substrate BF, a circuit layer ML, a light emitting element layer EL, and an encapsulation substrate ECL.

The base substrate BF may include a plastic substrate, a glass substrate, an organic/inorganic composite substrate, etc. Alternatively, the base substrate BF may be a laminated structure including a plurality of insulating layers. The plastic substrate may include at least one of, for example, an acrylic resin, a methacrylic resin, polyisoprene, a vinyl resin, an epoxy resin, a urethane resin, a cellulose resin, a siloxane resin, a polyimide resin, a polyamide resin, or a perylene resin.

The circuit layer ML may include a plurality of insulating layers, a plurality of conductive layers, and a semiconductor layer. The plurality of conductive layers of the circuit layer ML may constitute control circuits of signal lines or pixels.

The light emitting element layer EL includes a display element such as, for example, organic light emitting diodes. However, the present invention is not limited thereto. For example, depending on the type of the display member 100, the light emitting element layer EL may include inorganic light emitting diodes or organic-inorganic hybrid light emitting diodes.

The encapsulation substrate ECL encapsulates the light emitting element layer EL. The encapsulation substrate ECL protects the light emitting element layer EL from foreign materials such as, for example, moisture, oxygen, and dust particles. The encapsulation substrate ECL may be bonded to the base substrate BF through a sealing portion SLP. The sealing portion SLP may include an organic material such as, for example, a frit or an epoxy resin. However, this is merely illustrative, and the material constituting the sealing portion SLP is not limited thereto.

The touch sensing layer 200 may be disposed on the encapsulation substrate ECL. In FIG. 2, the encapsulation substrate ECL is included in the display member 100. However, the present invention is not limited there to. For example, in exemplary embodiments, the encapsulation substrate ECL may be included in the touch sensing layer 200. In this case, the encapsulation substrate ECL may be referred to as a base layer ECL.

Further, in FIG. 2, it is illustrated that the touch sensing layer 200 is directly formed on the encapsulation substrate ECL. However, the present invention is not limited thereto.

For example, in exemplary embodiments, an adhesive member is provided between the touch sensing layer 200 and the encapsulation substrate ECL, and the touch sensing layer 200 and the encapsulation substrate ECL may be bonded to each other by the adhesive member.

In exemplary embodiments, the aforementioned encapsulation substrate ECL may be replaced with a thin film encapsulation layer. A detailed description thereof will be described with reference to FIG. 3.

Figure 3:
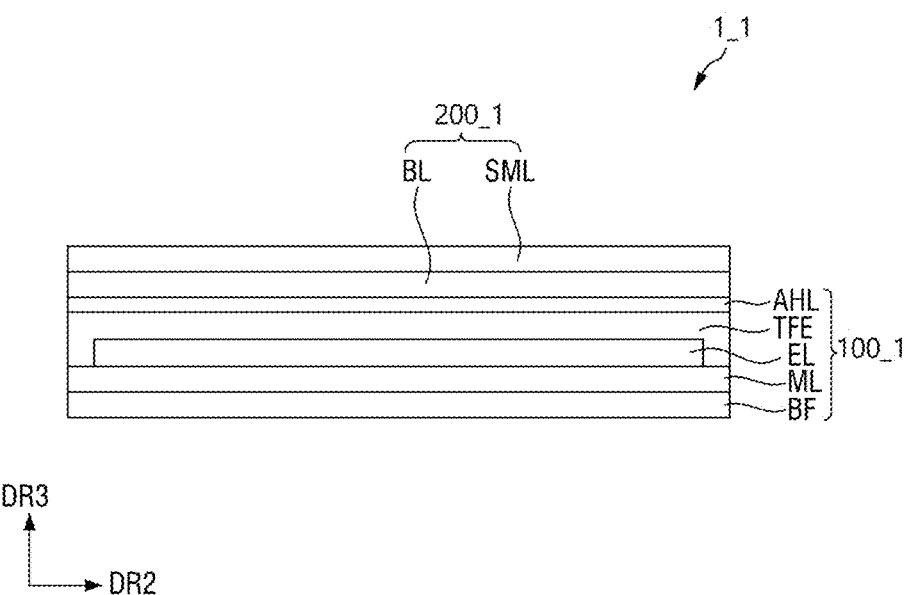
FIG. 3 is a schematic cross-sectional view of a display device according to an exemplary embodiment.

FIG. 3 is a schematic cross-sectional view of a display device according to an exemplary embodiment.

Referring to FIG. 3, a display device 1_1 includes a display member 100_1 and a touch sensing layer 200_1. The display member 100_1 may include a base substrate BF, a circuit layer ML, a light emitting element layer EL, and a thin film encapsulation layer TFE.

The thin film encapsulation layer TFE encapsulates the light emitting element layer EL. The thin film encapsulation layer TFE may include at least one insulating layer. In an exemplary embodiment, the thin film encapsulation layer TFE may include at least one organic film and at least one encapsulation inorganic film.

The encapsulation inorganic film protects the light emitting element layer EL from, for example, moisture/oxygen, and the encapsulation organic film protects the light emitting element layer EL from foreign materials such as, for example, dust particles. The encapsulation inorganic film may include, for example, a silicon nitride layer, a silicon oxynitride layer, a silicon oxide layer, a titanium oxide layer, or an aluminum oxide layer. However, the encapsulation inorganic film is not limited thereto. The encapsulation organic film may include, for example, an acrylic based organic film. However, the encapsulation organic film is not limited thereto.

The touch sensing layer 200_1 may include a base layer BL and a sensing circuit layer SML. The sensing circuit layer SML may include a plurality of insulating layers and a plurality of conductive layers. For example, the conductive layers of the sensing circuit layer SML may constitute a sensing pattern, a sensing line, and a connection line.

The touch sensing layer 200_1 and the display member 100_1 may be bonded to each other by an adhesive member AHL. The adhesive member AHL may be an organic adhesive layer such as, for example, an optically clear adhesive film (OCA), an optically clear resin (OCR), or a pressure sensitive adhesive film (PSA).

In an exemplary embodiment, the adhesive member AHL and the base layer BL of the touch sensing layer 200_1 may be omitted. In this case, the sensing circuit layer SML may be formed and provided on the thin film encapsulation layer TFE by a continuous process.

Figure 4:
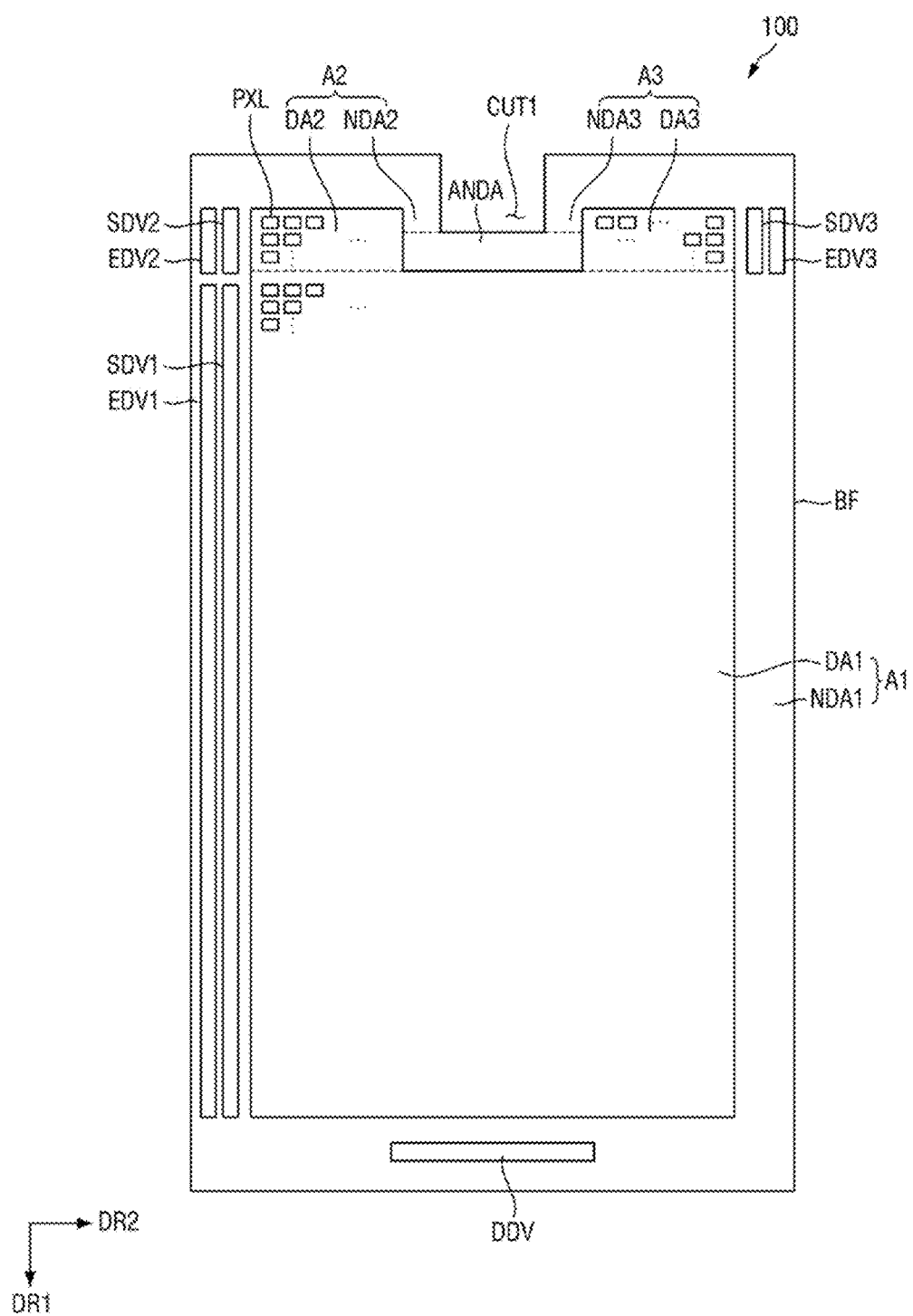
FIG. 4 is a plan view illustrating a display member according to an exemplary embodiment.

FIG. 4 is a plan view illustrating a display member according to an exemplary embodiment. For example, FIG. 4 illustrates the display member 100 illustrated in FIG. 1 according to an exemplary embodiment.

Referring to FIG. 4, the display member 100 may include a base substrate BF, pixels PXL, a driver, a power supply unit, a line unit, etc.

The base substrate BF includes a plurality of regions, and at least two of the regions may have different areas. The base substrate BF may be provided in substantially the same shape corresponding to the shape of the touch sensor layer 200. The base substrate BF may have the same area as the touch sensor layer 200, or may have a larger area than the touch sensor layer 200. In an exemplary embodiment, the base substrate BF may have first, second, and third areas A1, A2, and A3 having different areas from one another.

Each of the first to third areas A1, A2, and A3 may have various shapes. For example, each of the first to third areas A1, A2, and A3 may be provided in various shapes, such as a closed polygon including straight sides, a circle, an oval, or the like including curved sides, and a semicircle, a semi-ellipse, or the like including straight sides and curved sides.

The first to third areas A1, A2 and A3 are divided into display areas DA1, DA2 and DA3 (hereinafter collectively referred to as DA) and non-display areas NDA1, NDA2 and NDA3 (hereinafter collectively referred to as NDA). The display area DA is an area including the pixels PXL that display an image.

In an exemplary embodiment, each of the display areas DA1, DA2 and DA3 may have a shape substantially corresponding to the shape of each of the first to third areas A1, A2 and A3, respectively.

The non-display area NDA is an area in which the pixels PXL are not provided, and is an area in which the image is not displayed. In the non-display area NDA, first to third scan drivers SDV1, SDV2, and SDV3 providing a scan signal to each pixel PXL according to a scan line, first to third light emitting drivers EDV1, EDV2, and EDV3 providing a light emitting control signal to each pixel PXL along a light emitting control line, a data driver DDV providing a data signal to each pixel PXL along a data line, a timing controller, a power supply unit applying power to the pixels PXL, and lines connecting the pixels PXL and the drivers may be provided. The non-display area NDA corresponds to a bezel in the final display device, and the width of the bezel may be determined according to the width of the non-display area NDA.

Each of the first to third areas A1, A2, and A3 will be described as follows.

The first area A1 may have the largest area among the first to third areas A1, A2, and A3. The first area A1 may include the first display area DA1 in which an image is displayed and the first non-display area NDA1 surrounding at least a part of the first display area DA1.

The second area A2 may have a smaller area than the first area A1. The second area A2 may include the second display area DA2 in which an image is displayed and the second non-display area NDA2 surrounding at least a part of the second display area DA2. The third area A3 may have a smaller area than the first area A1. For example, the third area A3 may have substantially the same area as the second area A2. The third area A3 may include the third display area DA3 in which an image is displayed and the third non-display area NDA3 surrounding at least a part of the third display area DA3.

The base substrate BF may have a shape in which the second and third areas A2 and A3 protrude from the first area A1 in the first direction DR1. In the base substrate BF, the second and third areas A2 and A3 may be spaced apart from each other at a predetermined distance. Therefore, the base substrate BF may have a shape in which a region between the second and third areas A2 and A3 is recessed. For example, the base substrate BF may include a trench shape between the second and third areas A2 and A3. The trench-shaped area may be a first cutting portion CUT1 in which a part of the base substrate BF is cut and removed by a cutting process.

In an exemplary embodiment, the base substrate BF may further include an additional non-display area ANDA.

The additional non-display area ANDA may be provided adjacent to the first display area DA1, the second display area DA2, and the third display area DA3. Further, the additional non-display area ANDA may connect the second display area DA2 and the third display area DA3.

Figure 5:
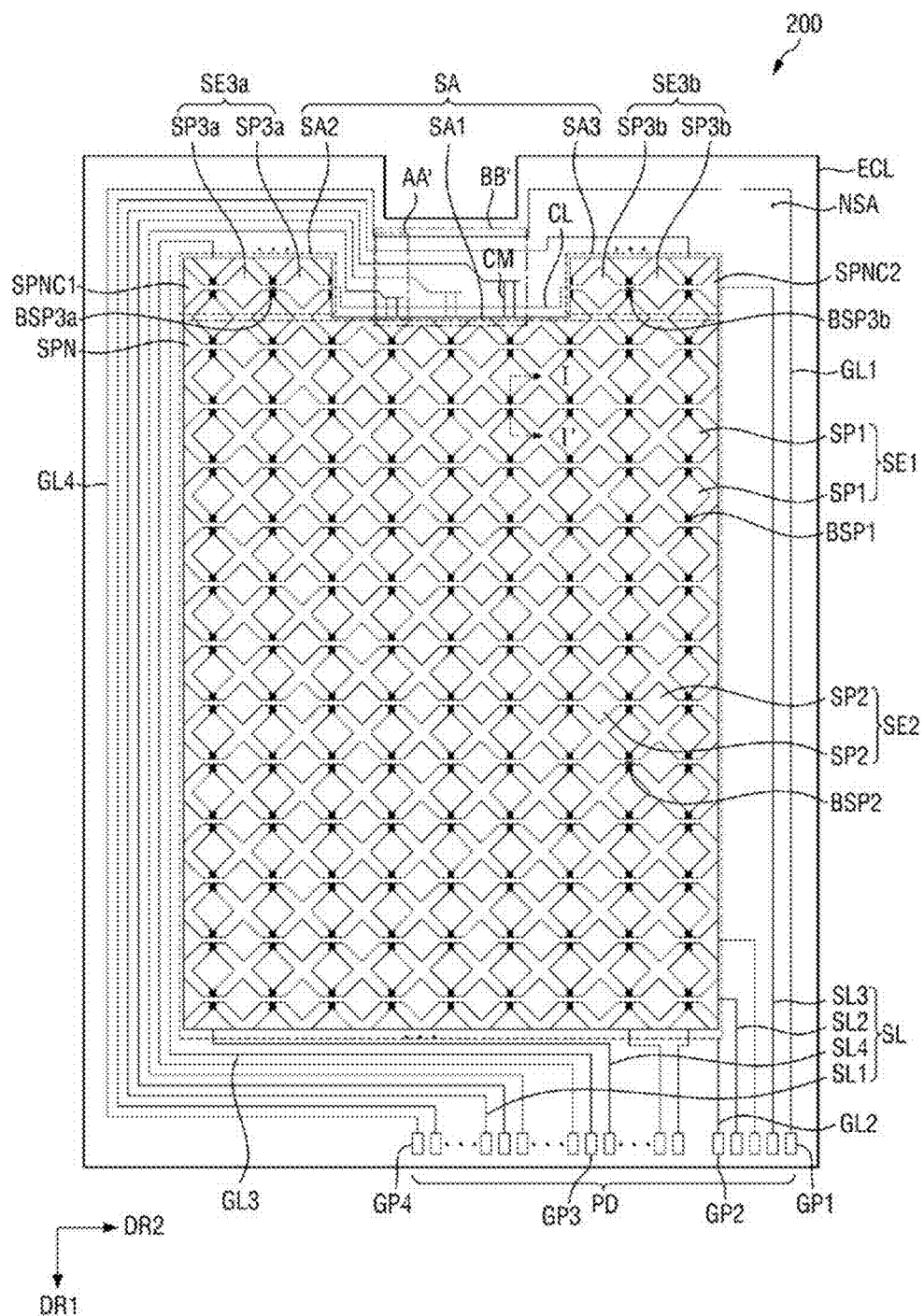
FIG. 5 is a plan view of a touch sensor layer according to an exemplary embodiment.
Figure 6:
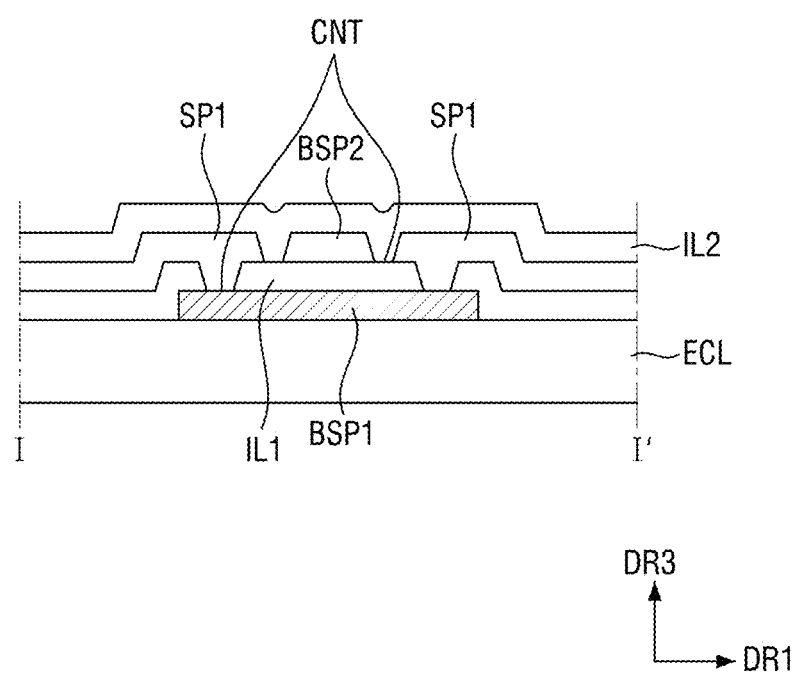
FIG. 6 is a cross-sectional view taken along line I-I' illustrated in FIG. 5 according to an exemplary embodiment.

FIG. 5 is a plan view of a touch sensor layer according to an exemplary embodiment. For example, FIG. 5 illustrates the touch sensor layer 200 of FIG. 1 according to an exemplary embodiment. FIG. 6 is a cross-sectional view taken along line I-I' illustrated in FIG. 5.

Referring to FIG. 5, the base layer ECL may include a sensing area SA and a non-sensing area NSA adjacent to the sensing area SA. The base layer ECL may be the encapsulation substrate ECL described with reference to FIG. 2A or the base layer BL described with reference to FIG. 2B.

The sensing area SA may be an area that senses an input applied from the outside. The external input may be, for example, a touch by a user's hand or a touch made using a pointing device. The input applied from the outside may be provided in various forms. For example, the external input may include various types of external inputs such as a part of the user's body, a stylus pen, light, heat, or pressure. In addition to sensing an input caused by a part of the body, such as a user's hand, touching the device, a spatial touch (for example, hovering) such as approaching or neighboring the device, may also be a form of input.

The sensing area SA may include a first sensing area SA1, a second sensing area SA2, and a third sensing area SA3. The first sensing area SA1 may have a rectangular shape on a plane. The second sensing area SA2 and the third sensing area SA3 may protrude from the first sensing area SA1 in the first direction DR1. The first sensing area SA1 may be referred to as a normal portion and the second and third sensing areas SA2 and SA3 may be referred to as a trench portion. The area of the first sensing area SA1 may be larger than the area of the second sensing area SA2 and larger than the area of the third sensing area SA3.

In the exemplary embodiment illustrated in FIG. 5, the second and third sensing areas SA2 and SA3 are provided in addition to the first sensing area SA1. However, the number of sensing areas provided that protrude from the first sensing area SA1 is not limited thereto. For example, the number of sensing areas provided that protrude from the first sensing area SA1 may be one, or may be three or more. The camera module CMA and the speaker SP described with reference to FIG. 1 may be disposed in a region between the second sensing area SA2 and the third sensing area SA3. For example, the trench shape may be included in the region between the second sensing area SA2 and the third sensing area SA3. The trench-shaped area may be a second cutting portion in which a part of the encapsulation substrate ECL is cut and removed by a cutting process. The second cutting portion may overlap with the aforementioned first cutting portion in a thickness direction.

The second sensing area SA2 may protrude from one region of one edge of the first sensing area SA1 in the first direction DR1, and the third sensing area SA3 may protrude from the other region of one edge of the first sensing area SA1 in the first direction DR1. The second sensing area SA2 and the third sensing area SA3 may be spaced apart from each other in the second direction DR2.

A plurality of sensing patterns SPN, SPNC1, SPNC2, SP1, SP2, SP3a, and SP3b are arranged in the sensing area SA, and are used to sense the touch. The plurality of sensing patterns SPN, SPNC1, SPNC2, SP1, SP2, SP3a, and SP3b may include transparent conductive oxides. For example, the plurality of sensing patterns SPN, SPNC1, SPNC2, SP1, SP2, SP3a, and SP3b may include at least one of indium zinc oxide (IZO), indium tin oxide (ITO), indium gallium oxide (IGO), indium zinc gallium oxide (IGZO), and mixtures/ compounds thereof. However, the present invention is not limited thereto. For example, the plurality of sensing patterns SPN, SPNC1, SPNC2, SP1, SP2, SP3a, and SP3b may include metallic materials. The metallic material may include, for example, molybdenum, silver, titanium, copper, aluminum, or alloys thereof. In this case, the plurality of sensing patterns SPN, SPNC1, SPNC2, SP1, SP2, SP3a, and SP3b may be provided in a metal mesh structure to reduce the possibility that the patterns are visually recognized from the outside.

The plurality of sensing patterns SPN, SPNC1, SPNC2, SP1, SP2, SP3a and SP3b are divided into a normal sensing pattern SPN, a first trench sensing pattern SPNC1 and a second trench sensing pattern SPNC2 according to a disposed position. In addition, the plurality of sensing patterns SPN, SPNC1, SPNC2, SP1, and SP2 are divided into a first sensing pattern SP1, a second sensing pattern SP2, and third sensing patterns SP3a and SP3b according to which sensing electrode is constituted.

For example, the normal sensing pattern SPN may be a sensing pattern disposed in the first sensing area SA1, the first trench sensing pattern SPNC1 may be a sensing pattern disposed in the second sensing area SA2, and the second trench sensing pattern SPNC2 may be a sensing pattern disposed in the third sensing area SA3. In addition, the sensing patterns which are arranged in the first direction DR1 and electrically connected to each other may constitute a first sensing electrode SE1. The sensing patterns constituting the first sensing electrode SE1 may be referred to as the first sensing pattern SP1. The sensing patterns which are disposed in the first sensing area SA1 and arranged in the second direction DR2 and electrically connected to one another may constitute a second sensing electrode SE2. The sensing patterns constituting the second sensing electrode SE2 may be referred to as the second sensing pattern SP2. The sensing patterns which are disposed in the second sensing area SA2 and arranged in the second direction DR2 and electrically connected to each other may constitute a third sensing electrode SE3a. The sensing patterns constituting the third sensing electrode SE3a may be referred to as the third sensing pattern SP3a. The sensing patterns which are disposed in the third sensing area SA3 and arranged in the second direction DR2 and electrically connected to each other may constitute a third sensing electrode SE3b. The sensing patterns constituting the third sensing electrode SE3b may be referred to as the third sensing pattern SP3b.

For example, according to which sensing electrode the normal sensing pattern SPN, the first trench sensing pattern SPNC1, and the second trench sensing pattern SPNC2 constitute, a part of the normal sensing pattern SPN, the first trench sensing pattern SPNC1, and the second trench sensing pattern SPNC2 may be referred to as the first sensing pattern SP1, the other part of the normal sensing pattern SPN may be referred to as the second sensing pattern SP2, the other part of the first trench sensing pattern SPNC1 may be referred to as the third sensing pattern SP3a, and the other part of the second trench sensing pattern SPNC2 may be referred to as the third sensing pattern SP3b.

In exemplary embodiments, the third sensing electrodes SE3a and SE3b may be collectively referred to as a third sensing electrode that includes a first plurality of third sensing patterns SP3a disposed in the second sensing area SA2, arranged in the second direction DR2, and electrically connected to each other, as well as a second plurality of third sensing patterns SP3b disposed in the third sensing area SA3, arranged in the second direction DR2, and electrically connected to each other.

A plurality of first sensing electrodes SE1 may be arranged in the second direction DR2. A plurality of second sensing electrodes SE2 may be arranged in the first direction DR1.

In FIG. 5, the third sensing electrodes SE3a and SE3b are illustratively provided in the second sensing area SA2 and the third sensing area SA3, respectively. However, the present invention is not limited thereto. For example, in exemplary embodiments, the plurality of third sensing electrodes SE3a and SE3b may be provided in the second sensing area SA2 and the third sensing area SA3, respectively.

The first sensing patterns SP1 may be electrically connected to each other by a first sensing connection electrode BSP1. The first sensing connection electrode BSP1 may electrically connect two first sensing patterns SP1 disposed adjacent to each other. The second sensing patterns SP2 may be electrically connected to each other by a second sensing connection electrode BSP2. The second sensing connection electrode BSP2 may electrically connect two second sensing patterns SP2 disposed adjacent to each other. The second sensing connection electrode BSP2 may be disposed on the same electrode layer as the two second sensing patterns SP2 disposed adjacent to each other, and may be formed integrally with the second sensing patterns SP2. The third sensing patterns SP3a may be electrically connected to each other by a third sensing connection electrode BSP3a, and the third sensing patterns SP3b may be electrically connected to each other by a third sensing connection electrode BSP3b.

In the first sensing area SA1, the first sensing connection electrode BSP1 and the second sensing connection electrode BSP2 cross each other on a plane and may be insulated from each other on a cross section. In the second sensing area SA2, the first sensing connection electrode BSP1 and the third sensing connection electrode BSP3a cross each other on a plane and may be insulated from each other on a cross section. In the third sensing area SA3, the first sensing connection electrode BSP1 and the third sensing connection electrode BSP3b cross each other on a plane and may be insulated from each other on a cross section. The second sensing connection electrode BSP2, the third sensing connection electrode BSP3a, and the third sensing connection electrode BSP3b may be disposed on the same layer as each other and may be formed through the same process.

Sensing lines SL, which are electrically connected to the first to third sensing electrodes SE1, SE2, SE3a, and SE3b, may be disposed in the non-sensing area NSA. One end of each of the sensing lines SL may be connected to one of the first to third sensing electrodes SE1, SE2, SE3a, and SE3b, and the other end may be connected to a pad portion PD. The pad portion PD receives an electrical signal from an external driving circuit and may transmit the received electrical signal to at least one of the sensing lines SL, or transmit an external touch sensing signal generated in the sensing area SA to the driving circuit.

The sensing lines SL may include a first sensing line SL1, a second sensing line SL2, a third sensing line SL3, and a fourth sensing line SL4. The first sensing line SL1 may be connected to one end of the first sensing electrode SE1, the second sensing line SL2 may be connected to one end of the second sensing electrode SE2, and the third sensing line SL3 may be connected to one end of the third sensing electrode SE3b. The fourth sensing line SL4 may be connected to the other end of the first sensing electrode SEL For example, one side of the first sensing electrode SE1 is connected to the pad portion PD through the first sensing line SL1 and the other side of the first sensing electrode SE1 is connected to the pad portion PD through the fourth sensing line SL4. By connecting a plurality of lines to one sensing electrode, problems such as a decrease in sensitivity due to a voltage drop of an electrical signal depending on a position may be improved.

The first trench sensing pattern SPNC1 and the second trench sensing pattern SPNC2 spaced apart from each other in the second direction DR2 may be electrically connected to each other by a connection line CL. For example, the third sensing electrode SE3a disposed in the second sensing area SA2 and the third sensing electrode SE3b disposed in the third sensing area SA3 may be electrically connected to each other by the connection line CL. One end of the connection line CL is connected to the third sensing electrode SE3a and the other end of the connection line CL is connected to the third sensing electrode SE3b. Accordingly, the third sensing electrode SE3a may receive an electrical signal from the driving circuit through the third sensing line SL3, or may transmit a sensing signal to the driving circuit.

The connection line CL may be disposed between the first sensing line SL1 and the first sensing area SA1 For example, the connection line CL may be disposed between the first sensing line SL1 and the normal sensing pattern SPN. The area in which the connection line CL is disposed may be the non-sensing area NSA between the second sensing area SA2 and the third sensing area SA3.

The first sensing line SL1 is spaced apart from the first sensing electrode SE1 in the first sensing area SA1 by the connection line CL. Accordingly, a connection portion CM may be provided to connect the first sensing line SL1 and the first sensing electrode SE1 in the first sensing area SAL A part of the connection portion CM is connected to the first sensing line SL1, and the other part of the connection portion CM is connected to the first sensing electrode SE1. Accordingly, the first sensing line SL1 and the first sensing electrode SE1 may be electrically connected to each other. In the exemplary embodiment illustrated in FIG. 5, the first sensing electrode SE1 connected to the connection portion CM may be the first sensing electrode SE1 constituted by the normal sensing pattern SPN.

The touch sensor layer 200 may further include a plurality of ground lines GL1, GL2, GL3, and GL4 that supply a ground voltage GND to the first to third sensing areas SA1, SA2, and SA3, respectively.

One end of the first ground line GL1 is connected to a first ground pad GP1 of the plurality of pads provided on the pad portion PD. The first ground line GL1 may extend substantially in parallel with the third sensing line SL3 toward an upper right region of the non-sensing area NSA.

One end of the second ground line GL2 is connected to a second ground pad GP2 of the plurality of pads provided in the pad portion PD. The second ground line GL2 may be disposed between the second sensing line SL2 and the fourth sensing line SL4.

One end of the third ground line GL3 is connected to a third ground pad GP3 of the plurality of pads provided in the pad portion PD. The third ground line GL3 may be disposed between the first sensing line SL1 and the fourth sensing line SL4 up to a lower right region of the non-sensing area NSA, and may extend substantially in parallel with the first sensing line SL1 toward an upper left region of the non-sensing area NSA.

One end of the fourth ground line GL4 is connected to a fourth ground pad GP4 of the plurality of pads provided in the pad portion PD. The fourth ground line GL4 may extend to the lower left region of the non-sensing area NSA from the fourth ground line GL4 in parallel with the first sensing line SL1, may extend to an upper left region from the lower left region, and may extend to an upper right region from the upper left region. The fourth ground line GL4 may be disposed along the trench shape when extending from the upper left region to the upper right region.

In exemplary embodiments, one end of the first ground line GL1 and one end of the fourth ground line GL4 are not connected to each other.

It is to be understood that the number of ground lines and the line shapes illustrated in FIG. 5 are exemplary, and the present invention is not limited thereto. A detailed description of the ground line GL is provided below.

Referring to FIG. 6, the first sensing connection electrode BSP1 may be disposed directly on the encapsulation substrate ECL. A first insulating layer IL1 may be disposed between the first sensing connection electrode BSP1 and the second connection electrode BSP2 and the first sensing patterns SP1. A contact hole CNT may be provided in the first insulating layer IL1 The contact hole(s) CNT may be provided only in a region overlapping with the first sensing connection electrode BSP1 on a plane. For example, in exemplary embodiments, the contact hole(s) CNT is only disposed in an area that overlaps the first sensing connection electrode BSP1 on a plane, and is not disposed in other areas that do not overlap the first sensing connection electrode BSP1 on a plane. The first sensing patterns SP1 may be in contact with the first sensing connection electrode BSP1 through the contact hole(s) CNT. For example, in exemplary embodiments, portions of the first sensing patterns SP1 may extend through the contact hole(s) CNT and may directly contact the first sensing connection electrode BSP1 through the contact hole(s) CNT. The second sensing connection electrode BSP2 may be separated between the first sensing patterns SP1. For example, an opening may be disposed between adjacent first sensing patterns SP1, and the second sensing connection electrode BSP2 may be disposed in the opening. A second insulating layer IL2 may be disposed on the first sensing connection electrode BSP1, the second connection electrode BSP2, and the first sensing patterns SP1.

The first sensing patterns SP1 may be electrically connected to each other by the first sensing connection electrode BSP1. The first sensing connection electrode BSP1 may electrically connect two first sensing patterns SP1 disposed adjacent to each other. The second sensing patterns SP2 may be electrically connected to each other by the second sensing connection electrode BSP2. The second sensing connection electrode BSP2 may electrically connect two second sensing patterns SP2 disposed adjacent to each other. The first sensing connection electrode BSP1 and the second sensing connection electrode BSP2 cross each other on a plane and may be insulated from each other on a cross section.

Figure 7:
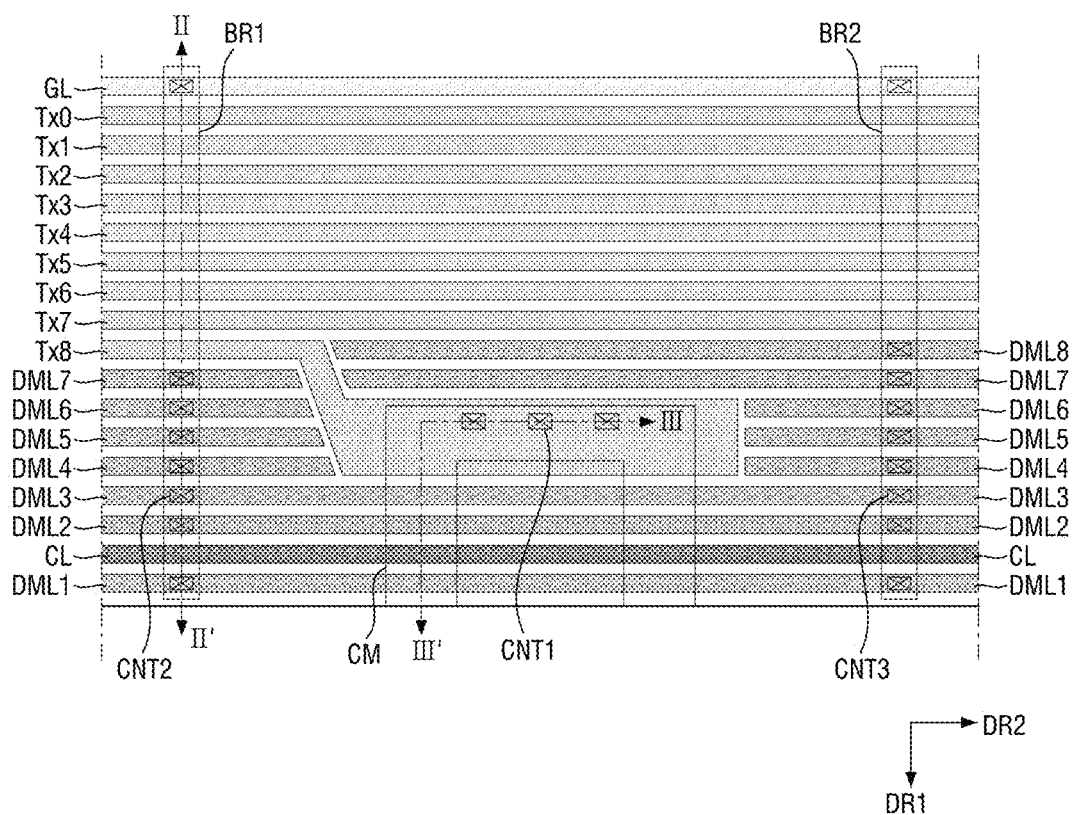
FIG. 7 is an enlarged view illustrating area AA' illustrated in FIG. 5 according to an exemplary embodiment.
Figure 8:
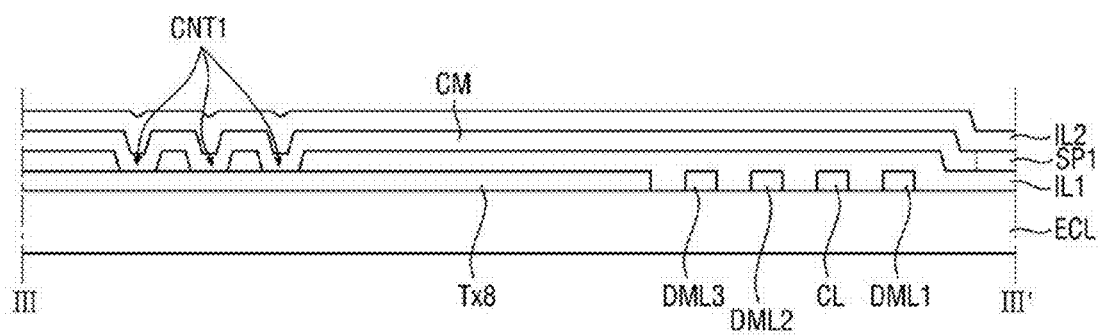
FIG. 8 is a cross-sectional view taken along line III-III' illustrated in FIG. 5 according to an exemplary embodiment.
Figure 9:
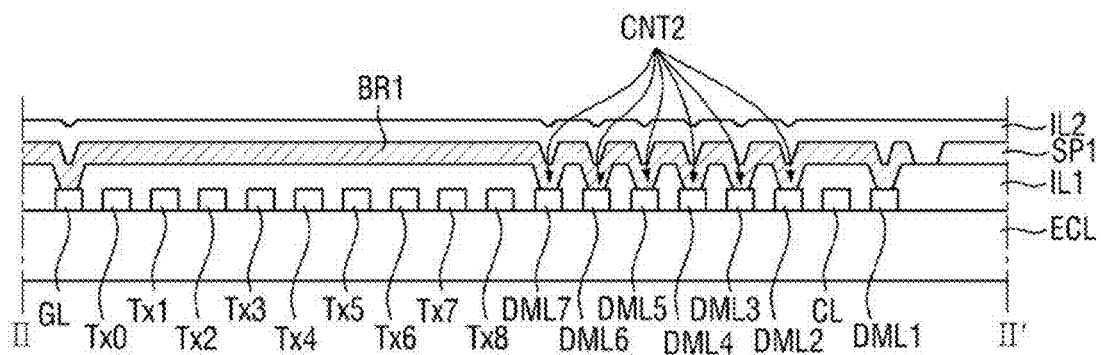
FIG. 9 is a cross-sectional view taken along line II-II' illustrated in FIG. 5 according to an exemplary embodiment.

FIG. 7 is an enlarged view illustrating area AA' illustrated in FIG. 5 according to an exemplary embodiment. FIG. 8 is a cross-sectional view taken along line III-III' illustrated in FIG. 7 according to an exemplary embodiment. FIG. 9 is a cross-sectional view taken along line II-II' illustrated in FIG. 7 according to an exemplary embodiment.

Referring to FIG. 7, both ends of the connection portion CM may extend in the first direction D1 from the first sensing pattern SP1 to a first driving line Tx8. When both ends of the connection portion CM and a first contact hole CNT1 overlap with each other on a plane, charges accumulated on the first driving line Tx8 may flow into the connection line CL in a process of discharging. This may break the first insulating layer IL1 disposed between the connection portion CM and the connection line CL, and may cause a short circuit between the connection portion CM and the connection line CL. According to the exemplary embodiment illustrated in FIG. 7, the probability that the first insulating layer IL1 is broken by a discharge phenomenon occurring adjacent to the first contact hole CNT1 formed on the first driving line Tx8 may be reduced. The first sensing pattern SP1 illustrated in FIG. 6 may also be referred to as the normal sensing pattern SPN disposed in the first sensing area SA1 described above in FIG. 4, and a plurality of driving lines Tx0 to Tx8 may also be referred to as a first sensing line SL1.

In FIG. 7, a plurality of first contact holes CNT1 are provided. However, the present invention is not limited thereto. For example, the first contact hole CNT1 may also be provided as a single hole. The arrangement form of the first contact holes CNT1 can be variously modified in any form as long as the connection portion CM and the first driving line Tx8 can be connected.

To prevent a short circuit from occurring, the first driving line Tx8 may be spaced apart from the connection line CL at a predetermined distance. As a result, the probability that the first insulating layer IL1 overlapping with the connection line CL on a plane is broken by a discharge phenomenon occurring adjacent to the first contact hole CNT1 formed on the first driving line Tx8 may be reduced according to exemplary embodiments.

The touch sensing layer 200 may include a plurality of dummy lines DML1, DML2, DML3, DML4, DML5, DML6, DML7 and DML8. Herein, a dummy line is a line to which no signal is provided. Some of the dummy lines may be disposed around the first driving line Tx8. For example, as shown in FIG. 7, in an exemplary embodiment, dummy lines DML4, DML5, DML6 and DML7 may surround portions of the first driving line Tx8 in the second direction D2, and dummy lines DML1, DML2, DML3, DML7 and DML8 may surround portions of the first driving line Tx8 in the first direction DR1. Some of the dummy lines on the plane may surround the periphery of the region in which the first contact hole CNT1 is formed. Some of the dummy lines may also be disposed between the first driving line Tx8 and the connection line CL.

Further, a ground line GL may be disposed around a second driving line Tx0. In FIG. 7, for convenience of illustration, the ground line is not specifically distinguished, and is generally referred to as GL. However, it is to be understood that in exemplary embodiments, the ground line disposed around the second driving line Tx0 is the fourth ground line GL4 described above. The ground line GL and the first dummy line DML1 to the eighth dummy line DML8 may be connected by bridge lines BR1 and BR2, respectively.

The bridge lines may include a first bridge line BR1 and a second bridge line BR2. The first and second bridge lines BR1 and BR2 may extend in the first direction DR1, respectively. The first bridge line BR1 may be disposed on one side with respect to the connection portion CM, and the second bridge line BR2 may be disposed on the other side of the connection portion CM. For example, in an exemplary embodiment, the first bridge line BR1 and the second bridge line BR2 may be symmetrically disposed relative to the connection portion CM.

The first bridge line BR1 traverses the ground line GL, the plurality of first sensing lines SL1, the plurality of dummy lines DML1 to DML7, and the connection line CL, and may be electrically connected to the ground line GL and the plurality of dummy lines DML1 to DML7 through a second contact hole CNT2. The second bridge line BR2 traverses the ground line GL, the plurality of first sensing lines SL1, the plurality of dummy lines DML1 to DML8, and the connection line CL, and may be electrically connected to the ground line GL and the plurality of dummy lines DML1 to DML8 through a third contact hole CNT3.

The plurality of dummy lines DML1 to DML8 may be divided into a first dummy line DML1 and second dummy lines DML2 to DML8. The first dummy line DML1 may be electrically connected to the first bridge line BR1 and the second bridge line BR2. The second dummy lines DML2 to DML8 may be divided into the dummy lines DML4 to DML7 belonging to a first segment, and the dummy lines DML4 to DML8 belonging to a second segment which is physically separated and insulated from the dummy lines DML4 to DML7 belonging to the first segment. The dummy lines DML4 to DML7 belonging to the first segment may be electrically connected to the first bridge line BR1 through the second contact hole CNT2, and the dummy lines DML4 to DML8 belonging to the second segment may be electrically connected to the second bridge line BR2 through the third contact hole CNT3.

Referring to FIG. 8, the first driving line Tx8, the dummy lines DML1 to DML3, and the connection line CL are disposed on the same layer. For example, the first driving line Tx8, the dummy lines DML1 to DML3, and the connection line CL may be disposed on the base layer ECL. The first driving line Tx8, the dummy lines DML1 to DML3, and the connection line CL may be simultaneously formed through the same process.

The first driving line Tx8, the dummy lines DML1 to DML3, and the connection line CL are covered by the first insulating layer IL1. The connection portion CM and the first sensing pattern SP1 may be disposed on the first insulating layer IL1. The connection portion CM and the first sensing pattern SP1 may be simultaneously formed through the same process. The connection portion CM and the first sensing pattern SP1 are covered by the second insulating layer IL2. The first insulating layer IL1 and the second insulating layer IL2 may be inorganic layers or organic layers. In the case in which the first insulating layer IL1 and the second insulating layer IL2 are inorganic layers, the first insulating layer IL1 and the second insulating layer IL2 may be formed of at least one of, for example, silicon oxide, silicon nitride, or silicon oxynitride. However, the present invention is not limited thereto.

The first insulating layer IL1 is disposed between the connection portion CM and the first driving line Tx8 on the cross section. A first contact hole(s) CNT1 may be provided in the first insulating layer IL1. The first contact hole(s) CNT1 may be provided in a region overlapping with the connection portion CM on a plane. The connection portion CM may be in contact with the first driving line Tx8 through the first contact hole(s) CNT1. For example, the connection portion CM may extend through the first contact hole(s) CNT1 and directly contact the first driving line Tx8.

The first sensing connection electrode BSP1 may be disposed on the same layer as the first driving line Tx8, the dummy lines DML1, DML2 and DML3, and the connection line CL, and the second sensing connection electrode BSP2 may be disposed on the same layer as the connection portion CM and the first sensing pattern SP1. The first sensing connection electrode BSP1 and the second sensing connection electrode BSP2 may be insulated from each other by the first insulating layer IL1 disposed therebetween.

In an exemplary embodiment, the connection portion CM may include the same material as the first sensing pattern SP1. For example, the connection portion CM may include a transparent conductive oxide. For example, the connection portion CM may include at least one of indium zinc oxide (IZO), indium tin oxide (ITO), indium gallium oxide (IGO), indium zinc gallium oxide (IGZO), and mixtures/compounds thereof. In an exemplary embodiment, the connection portion CM may include a metallic material. The metallic material may include, for example, molybdenum, silver, titanium, copper, aluminum, or alloys thereof.

According to the exemplary embodiment illustrated in FIG. 8, the first contact hole(s) CNT1 may be spaced apart from both ends of the connection portion CM. Accordingly, even if the first insulating layer IL is broken, the probability that the electric charges discharged through the first contact hole(s) CNT1 flow through both ends of the connection portion CM may be reduced. Therefore, a short circuit may be prevented from occurring between the connection portion CM and the connection line CL, and the product reliability may be improved.

Referring to FIG. 9, the driving lines Tx0 to Tx8, the dummy lines DML1 to DML7, and the connection line CL are disposed on the same layer. For example, the driving lines Tx0 to Tx8, the dummy lines DML1 to DML7, and the connection line CL may be disposed on the base layer ECL. The driving lines Tx0 to Tx8, the dummy lines DML1 to DML7, and the connection line CL may be simultaneously formed through the same process. The driving lines Tx0 to Tx8, the dummy lines DML1 to DML7, and the connection line CL are covered by the first insulating layer IL1.

The bridge line BR1 may be disposed on the first insulating layer IL1. The bridge line BR1 may be disposed on the same layer when the first sensing pattern SP1 is disposed on the first insulating layer IL1. Accordingly, the bridge line BR1 and the first sensing pattern SP1 may be simultaneously formed through the same process. The bridge line BR1 and the first sensing pattern SP1 are covered by the second insulating layer IL2.

The first insulating layer IL1 is disposed between the bridge line BR1 and the dummy lines DML1 to DML7 on the cross section. Second contact hole(s) CNT2 may be provided in the first insulating layer IL1. The second contact hole(s) CNT2 may be provided in a region overlapping with each of the dummy lines DML1 to DML7 on a plane. The bridge line BR1 may be in contact with each of the dummy lines DML1 to DML7 through the second contact hole(s) CNT. However, the present invention is not limited thereto. For example, the bridge line BR1 may be in contact with only some of the dummy lines DML1 to DML7.

The bridge line BR1 may include the same material as the first sensing pattern SP1. For example, the bridge line BR1 may include a transparent conductive oxide. For example, the bridge line BR1 may include at least one of indium zinc oxide (IZO), indium tin oxide (ITO), indium gallium oxide (IGO), indium zinc gallium oxide (IGZO), and mixtures/compounds thereof. As another example, the bridge line BR1 may include a metallic material. The metallic material may include, for example, molybdenum, silver, titanium, copper, aluminum, or alloys thereof.

According to the exemplary embodiment illustrated in FIG. 9, each of the dummy lines DML1 to DML7 may be connected to the ground line GL. Accordingly, the dummy lines DML1 to DML7 may perform the same function as the ground line GL, for example, supplying the ground voltage GND. As a result, a potential difference between the dummy lines DML1 to DML7 and the connection portion CM may be kept constant, so that a change in mutual capacitance of the first driving line Tx8 may be minimized or reduced. That is, the change in mutual capacitance of the first sensing line SL1 electrically connected to the connection portion CM may be minimized or reduced.

Electric charges may be accumulated in the first sensing line SL1 due to a plasma used in the process or another cause. After the first contact hole(s) CNT1 are provided in the first insulating layer IL1, the accumulated electric charges may be discharged through the first contact hole(s) CNT1. At this time, the first insulating layer IL1 adjacent to the region in which the first contact hole(s) CNT1 are formed may be broken. Even if a region of the first insulating layer IL1 overlapping with at least one of the dummy lines is broken to cause a short circuit between the connection portion CM and the dummy lines, the signal is not provided to the dummy lines, and thus, the signal transmitted or received through the first driving line Tx8 may not be affected.

However, when the short circuit occurs between the connection portion CM and at least one of the dummy lines, it may be recognized that the area of the first driving line Tx8 is increased. As a result, a change in mutual capacitance and/or resistance value of the first driving line Tx8 may be caused. That is, due to a difference between a load value around the second and third sensing areas SA2 and SA3 and a load value of the first sensing area SA1, the touch sensing layer 200 may not be able to implement a uniform touch recognition rate. In such a case, the user of the display device may recognize the touch failure, and thus, the reliability of the product may be reduced.

According to the exemplary embodiment illustrated in FIG. 9, each of the dummy lines DML1 to DML7 may be connected to the ground line GL. The ground line GL may be electrically connected to an external circuit unit through a ground pad. For example, the external circuit unit may be a touch driving circuit. Therefore, when the short circuit occurs between the connection portion CM and a dummy line, the external circuit unit may sense the change in mutual capacitance and/or resistance value of the first driving line Tx8 and may adjust the sensed change to a value of capacitance and/or resistance when the short circuit does not occur. That is, even when the connection portion CM electrically connected to the first sensing line SL1 and the dummy lines DML1 to DML7 are short-circuited, the touch sensing layer 200 may implement the uniform touch recognition rate, and the product reliability may be improved.

Hereinafter, an exemplary embodiment of the display device will be described. In the following description, for convenience of explanation, a further description of elements and technical aspects previously described above will be omitted or simplified, and the differences thereof will be mainly described.

Figure 10:
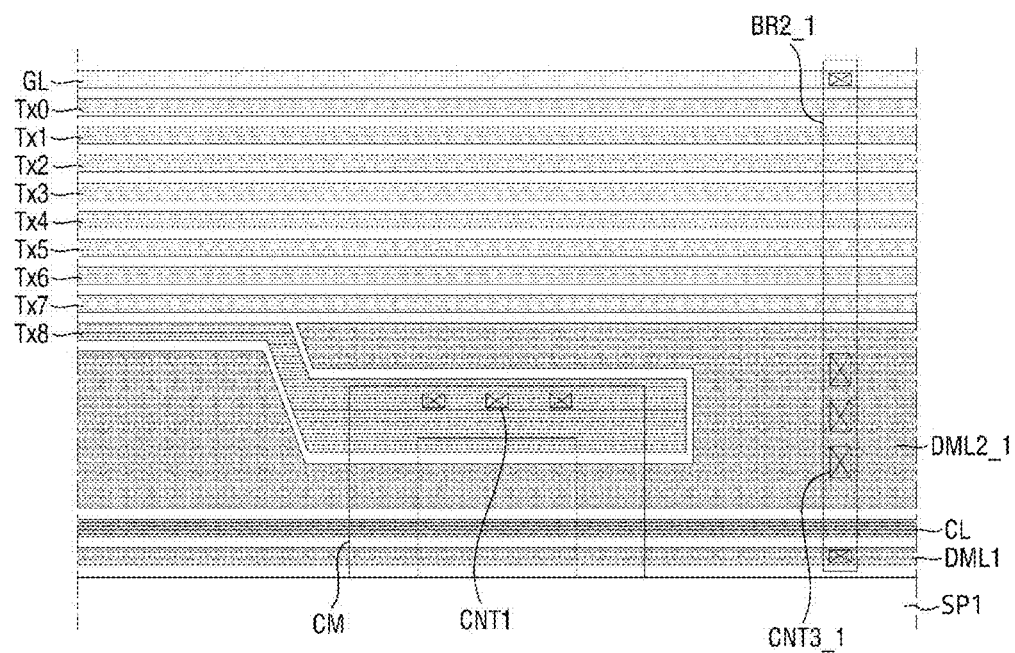
FIG. 10 is an enlarged plan view illustrating area AA' illustrated in FIG. 5 according to an exemplary embodiment.

FIG. 10 is an enlarged plan view illustrating area AA' illustrated in FIG. 4 according to an exemplary embodiment.

Referring to FIG. 10, there is a difference compared to the exemplary embodiment of FIG. 7 in that a bridge line BR2_1 according to the exemplary embodiment of FIG. 10 is disposed alone in the right side of the first driving line Tx8, and the dummy lines DML2 to DML8 illustrated in FIG. 7 are integrally formed to be replaced with a dummy line DML2_1.

For example, the connection line CL may be spaced apart from the first driving line Tx8 of the first sensing line SL1. The dummy line DML2_1 may be disposed between the first driving line Tx8 and the connection line CL, and the dummy line DML1 may be disposed between the connection line CL and the first sensing pattern SP1. Further, a ground line GL may be further disposed around the second driving line Tx0. The ground line GL and the dummy lines DML1 and DML2_1 can be connected to each other by the bridge line BR2_1. The dummy lines DML1 and DML2_1 and the bridge line BR2_1 may be connected to each other through a third contact hole CNT3_1. According to the exemplar embodiment of FIG. 10, when a short circuit occurs between the dummy line DML2_1 formed integrally and the connection portion CM, the amount of change in mutual capacitance and/or resistance value increases in a certain unit, and thus, the external circuit unit may efficiently adjust a load change amount. In exemplary embodiments, a width of the dummy line may be about 10 micrometers, and a distance between the dummy lines may be about 4 micrometers. The dummy lines may be integrally formed within a range in which the width does not exceed about 100 micrometers.

Figure 11:
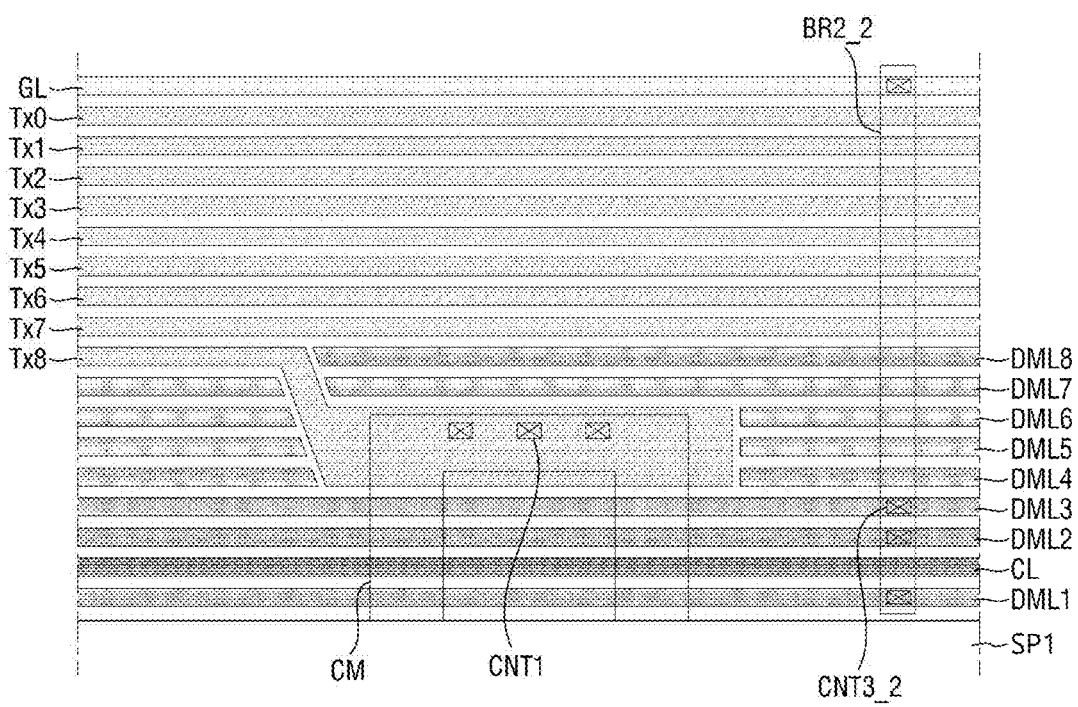
FIG. 11 is an enlarged plan view illustrating area AA' illustrated in FIG. 5 according to an exemplary embodiment.

FIG. 11 is an enlarged plan view illustrating area AA' illustrated in FIG. 4 according to an exemplary embodiment.

Referring to FIG. 11, there is a difference from the exemplary embodiment of FIG. 7 in that a bridge line BR2_2 according to the exemplary embodiment of FIG. 11 is disposed on the right side of the first driving line Tx8 alone, and the bridge line BR2_2 is connected only with the dummy lines DML1, DML2, and DML3.

For example, the connection line CL may be spaced apart from the first driving line Tx8 of the first sensing line SL1. The dummy lines DML2 to DML8 may be disposed between the first driving line Tx8 and the connection line CL, and the dummy line DML1 may be disposed between the connection line CL and the first sensing pattern SP1. Further, a ground line GL may be further disposed around the second driving line Tx0. The ground line GL and the dummy lines DML1, DML2, and DML3 may be connected to each other by the bridge line BR2_2. The dummy lines DML1, DML2, and DML3 and the bridge line BR2_2 may be connected to each other through a third contact hole CNT3_2. According to an exemplary embodiment, the dummy lines having a high probability of causing a short circuit with the connection portion CM may be the dummy lines DML2 and DML3 disposed between the first driving line Tx8 and the connection line CL, and the dummy line DML1 disposed between the connection line CL and the first sensing pattern SP1. However, if scratches are generated in the process, the short circuit with the connection portion CM may occur to the adjacent dummy lines DML4 to DML8. According to the exemplary embodiment illustrated in FIG. 11, by minimizing or reducing the dummy lines at which the short circuit with the connection portion CM occurs, it is possible to minimize or reduce the amount of change in mutual capacitance and/or resistance value at the occurrence of the short circuit, and to minimize or reduce the bridge lines BR1 and BR2.

Figure 12:
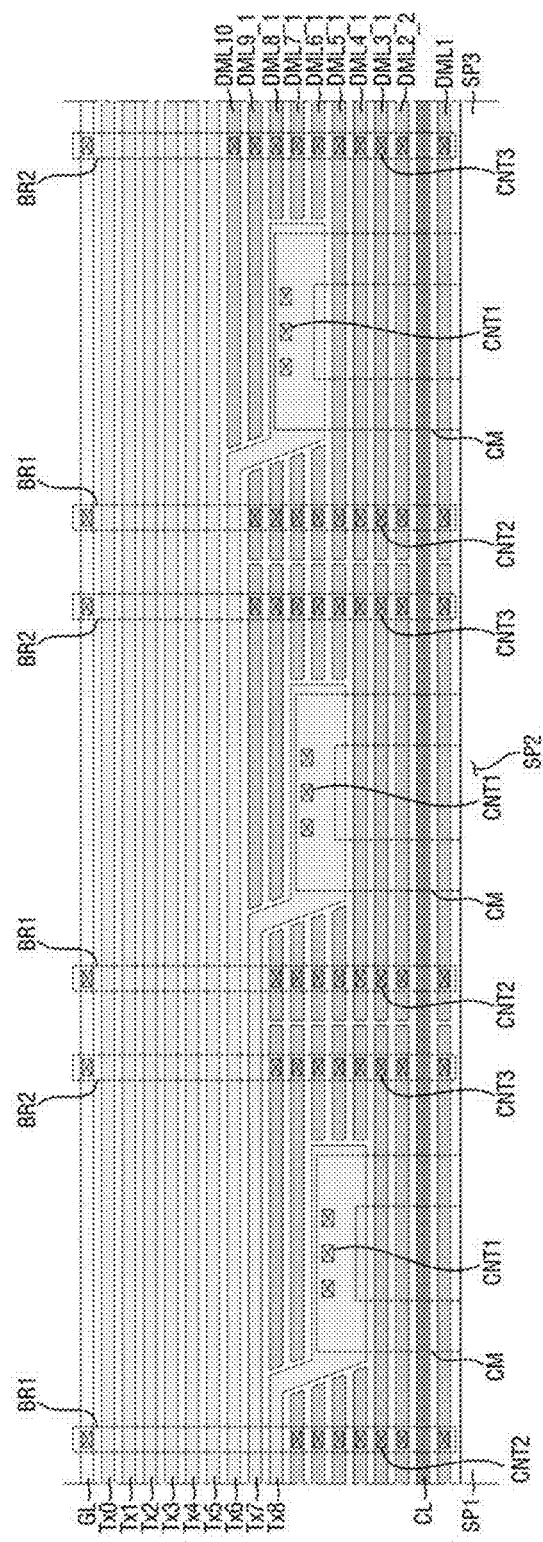
FIG. 12 is an enlarged plan view illustrating area BB' illustrated in FIG. 5 according to an exemplary embodiment.

FIG. 12 is an enlarged plan view illustrating area BB' illustrated in FIG. 5 according to an exemplary embodiment.

Referring to FIG. 12, both ends of a first connection portion CM1 may be extended in the first direction DR1 from the first sensing pattern SP1 to the first driving line Tx8. Both ends of a second connection portion CM2 may be extended in the first direction DR1 from the second sensing pattern SP2 to a third driving line Tx7. Both ends of a third connection portion CM3 may be extended in the first direction DR1 from the third sensing pattern SP2 to a fourth driving line Tx6.

When both ends of the first to third connection portions CM1 to CM3 and the first contact hole CNT1 overlap with each other on a plane, respectively, the electric charges accumulated on the first to third driving lines Tx8 to Tx6 may flow into the connection line CL in the process of discharging. This may break the first insulating layer IL1 disposed between each of the first to third connection portions CM1 to CM3 and the connection line CL, and may cause a result in which each of the first to third connection portions CM1 to CM3 and the connection line CL are short-circuited. According to the exemplary embodiment of FIG. 12, the probability that the first insulating layer IL1 is broken by a discharge phenomenon occurring adjacent to the first contact hole CNT1 formed on each of the first driving line Tx8 to the third driving line Tx6 may be reduced. The first sensing pattern SP1 to the third sensing pattern SP3 illustrated in FIG. 12 may be also referred to as a normal sensing pattern SPN disposed in the first sensing area SA1 to the third sensing area SA3, and the plurality of driving lines Tx0 to Tx8 may be also referred to as the first sensing line SL1.

In FIG. 12, it is illustrated that a plurality of first contact holes CNT1 are provided. However, the present invention is not limited thereto. For example, the first contact hole CNT1 may also be provided as a single hole. The arrangement form of the first contact holes CNT1 can be variously modified in any form as long as the first contact hole CNT1 may connect the first connection portion CM1 and the first driving line Tx8, connect the second connection portion CM2 and the third driving line Tx7, and connect the third connection portion CM3 and the fourth driving line Tx6.

To prevent an unnecessary short circuit, the first driving line Tx8 to the third driving line Tx6 may be spaced apart from the connection line CL at a predetermined distance. As a result, the probability that the first insulating layer IL1 overlapping with the connection line CL on a plane is broken by a discharge phenomenon occurring adjacent to the first contact hole CNT1 formed on the first driving line Tx8, the third driving line Tx6, and the fourth driving line Tx6 may be reduced.

Dummy lines DML1, DML2_2, DML3_1, DML4_1, DML5_1, DML6_1 and DML8_1 may be further disposed around the first driving line Tx8. The first dummy line DML1 to a ninth dummy line DML9_1 may be further disposed around the third driving line Tx6. The first dummy line DML1 to a tenth dummy line DML10 may be further disposed around the fourth driving line Tx6. The dummy lines are lines to which no signal is provided. The dummy lines DML1 to DML10 on the plane may be provided so as to surround the periphery of the region in which the first contact hole CNT1 is formed.

The first dummy line DML1 to the tenth dummy line DML10 illustrated in FIG. 12 are disposed separately for each of the first driving line Tx8, the third driving line Tx7 and the fourth driving line Tx6. As a result, the area of the dummy lines to which the bridge lines BR1 and BR2 to be described below are connected may be reduced. That is, when a short circuit occurs between the connection portion CM and the connection line CL, the change in the mutual inductance and/or the resistance value of the dummy line connected to each of the bridge lines BR1 and BR2 may be minimized or reduced. However, the present invention is not limited thereto. For example, each of the first dummy line DML1 to the tenth dummy line DML10 may be integrally formed.

Some of the dummy lines may further be disposed between the first driving line Tx8 and the connection line CL.

Further, a ground line GL providing a ground voltage GND may be further disposed around the second driving line Tx0. Here, the ground line GL may be referred to as the fourth ground line GL4 described above. The ground line GL and the first dummy line DML1 to the tenth dummy line DML10 may be connected to each other by the bridge lines BR1 and BR2, respectively.

The bridge lines BR1 and BR2 may be disposed on the left and right sides of each of the first connection portion CM1 to the third connection portion CM3, respectively. As a result, the area of the dummy line to which each of the bridge lines BR1 and BR2 is connected may be reduced. For example, when a short circuit occurs between the connection portion CM and the connection line CL, the change in the mutual inductance and/or the resistance value of the dummy line connected to each of the bridge lines BR1 and BR2 may be minimized or reduced.

The first insulating layer IL1 is disposed between the first and second bridge lines BR1 and BR2 and the dummy lines DML1 to DML10 on the cross section. The second and third contact holes CNT2 and CNT3 may be provided in the first insulating layer IL1. The second and third contact holes CNT2 and CNT3 may be provided in a region overlapping with each of the dummy lines DML1 to DML10 on a plane. The first bridge line and the second bridge line may be in contact with the respective dummy lines DML1 to DML10 through the second and third contact holes CNT2 and CNT3. However, the present invention is not limited thereto. For example, in exemplary embodiments, the first and second bridge lines BR1 and BR2 may be in contact with only some of the dummy lines DML1 to DML10.

Figure 13:
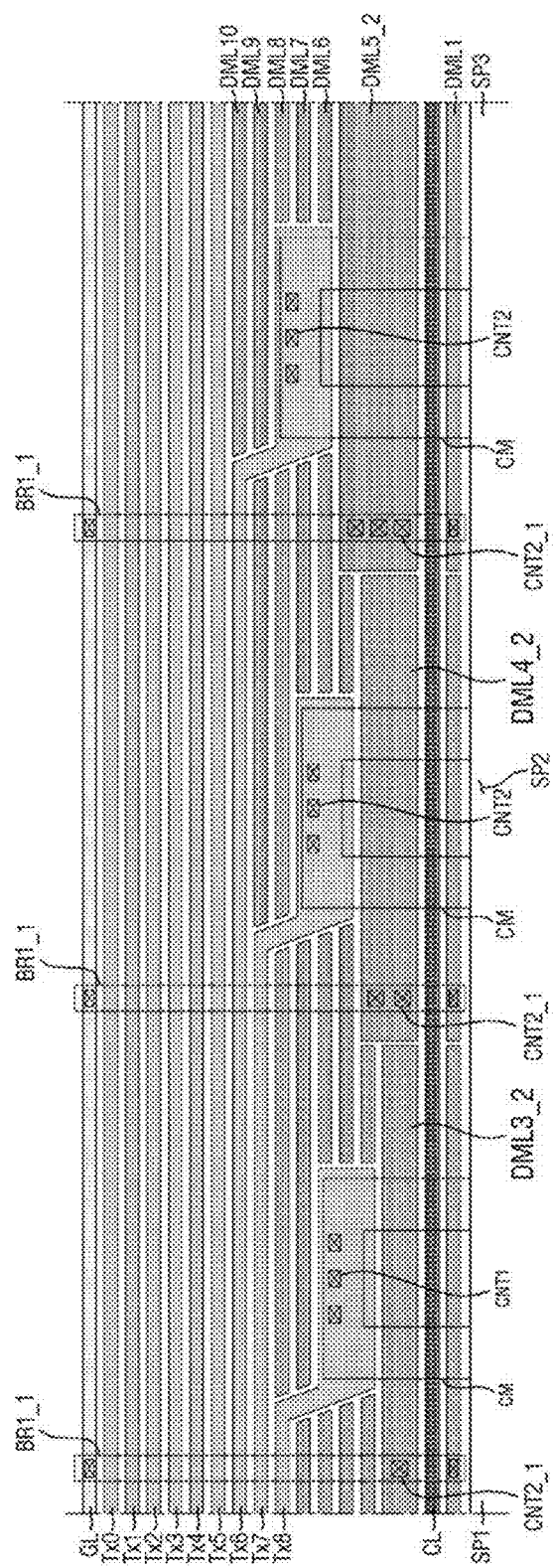
FIG. 13 is an enlarged plan view illustrating area BB' illustrated in FIG. 5 according to an exemplary embodiment.

FIG. 13 is an enlarged plan view illustrating area BB' illustrated in FIG. 4 according to an exemplary embodiment.

Referring to FIG. 13, there is a difference from the exemplary embodiment of FIG. 12 in that a bridge line BR1_1 according to the exemplary embodiment of FIG. 13 is disposed alone on the left side of the first connection portion CM1 to the third connection portion CM3, dummy lines DML2_2 to DML3_1 disposed between the first driving line Tx8 and the connection line CL illustrated in FIG. 12 are replaced with a dummy line DML3_2 integrally formed, dummy lines DML2_2 to DML4_1 disposed between the third driving line Tx7 and the connection line CL are replaced with a dummy line DML4_2 integrally formed, and dummy lines DML2_2 to DML5_1 disposed between the fourth driving line Tx6 and the connection line CL are replaced with a dummy line DML5_2 integrally formed, respectively.

For example, the connection line CL may be spaced apart from the first driving line Tx8, the third driving line Tx7, and the fourth driving line Tx6 of the first sensing line SL1. The dummy lines DML3_2, DML4_2 and DML5_2 may be disposed between the first driving line Tx8, the third driving line Tx7, and the fourth driving line Tx6 and the connection line CL, and the dummy line DML1 may be disposed between the connection line CL and the first to third sensing patterns SP1, SP2, and SP3. Further, a ground line GL may further be disposed around the second driving line Tx0. The ground line GL and the dummy lines DML1, DML3_2, DML4_2, and DML5_2 may be connected to each other by a bridge line BR1_1, respectively. The dummy lines DML1, DML3_2, DML4_2, and DML5_2 and the bridge line BR1_1 may be connected to each other through second contact holes CNT2_1. According to the exemplary embodiment of FIG. 13, when a short circuit occurs between the dummy lines DML3_2, DML4_2, and DML5_2 formed integrally and the first to third connection portions CM1, CM2, and CM3, the amount of change in mutual capacitance and/or resistance value increases in a certain unit, and thus, the external circuit unit may efficiently adjust a load change amount. In exemplary embodiments, a width of the dummy lines may be about 10 micrometers, and a distance between the dummy lines may be about 4 micrometers. The dummy line may be integrally formed within a range in which the width does not exceed about 100 micrometers.

Figure 14:
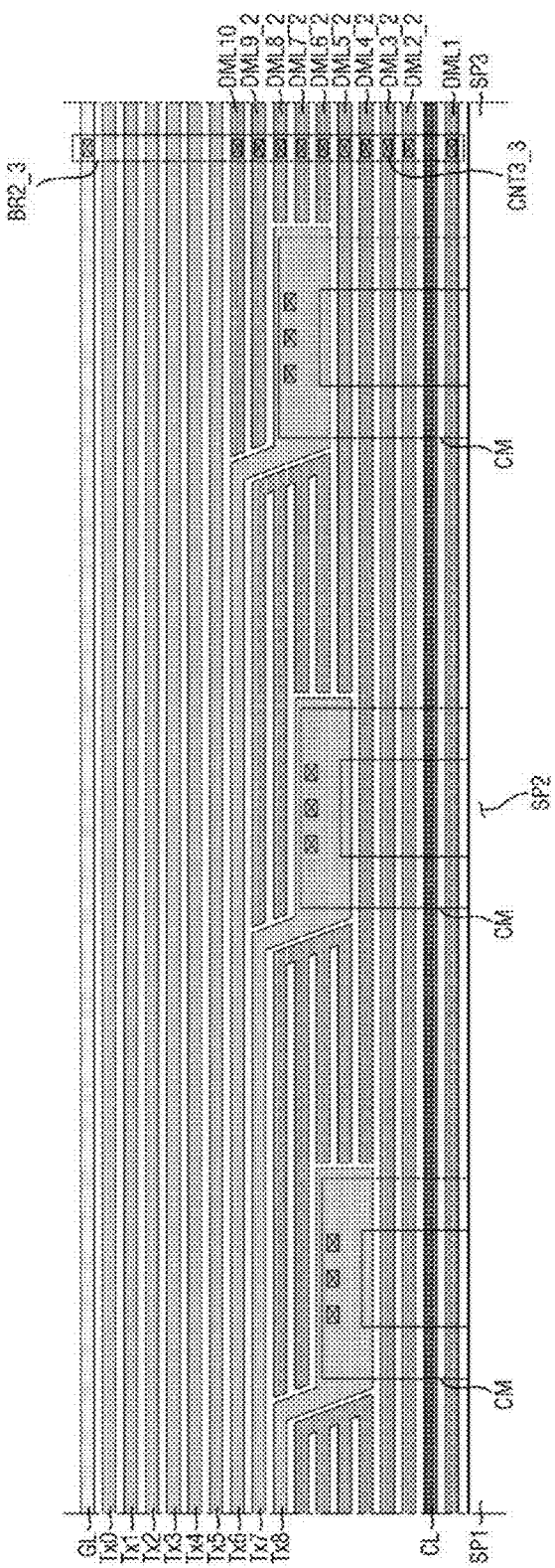
FIG. 14 is an enlarged plan view illustrating area BB' illustrated in FIG. 5 according to an exemplary embodiment.

FIG. 14 is an enlarged plan view illustrating area BB' illustrated in FIG. 5 according to an exemplary embodiment.

Referring to FIG. 14, there is a difference from the exemplary embodiment of FIG. 11 in that a second bridge line BR2_3 according to the exemplary embodiment of FIG. 13 is disposed on the right side of the third connection portion CM3, the first and second dummy lines DML1 and DML2_2 are integrally formed through the first to third connection portions CM1, CM2 and CM3, and some regions of the third dummy line DML3_3 to the ninth dummy line DML9_2 are electrically connected to each other.

For example, the connection line CL may be spaced apart from the first driving line Tx8, the third driving line Tx7, and the fourth driving line Tx6 of the first sensing line SL1. The dummy lines DML2_2, DML3_2, DML4_2, and DML5_2 may be disposed between the first driving line Tx8, the third driving line Tx7, the fourth driving line Tx6 and the connection line CL. One end of each of the third to seventh dummy lines DML3_2, DML4_2, DML5_2, DML6_2, and DML7_2 disposed around the first connection portion CM1 may be electrically connected to each other along the left side of the first driving line Tx8. One end of each of the fourth to eighth dummy lines DML4_2, DML5_2, DML6_2, DML7_2, and DML8_2 disposed around the second connection portion CM2 may be electrically connected to each other along the left side of the third driving line Tx7. One end of each of the fifth to ninth dummy lines DML5_2, DML6_2, DML7_2, DML8_2, and DML9_2 disposed around the third connection portion CM3 may be electrically connected to each other along the left side of the third driving line Tx7. The dummy line DML1 may be disposed between the connection line CL and the first to third sensing patterns SP1, SP2 and SP3.

Further, a ground line GL may be disposed around the second driving line Tx0. The ground line GL and the dummy lines DML1, DML2_2, DML3_2, DML4_2, DML5_2, DML6_2, DML7_2, DML8_2, DML9_2, and DML10 may be connected to each other by a second bridge line BR2_3, respectively. The dummy lines DML1, DML2_2, DML3_2, DML4_2, DML5_2, DML6_2, DML7_2, DML8_2, DML9_2, and DML10 and the second bridge line BR2_3 may be connected to each other through a third contact hole CNT3_3. According to the exemplary embodiment of FIG. 14, when a short circuit occurs between the first to tenth dummy lines DML1, DML2_2, DML3_2, DML4_2, DML5_2, DML6_2, DML7_2, DML8_2, DML9_2, and DML10 and the first to third connection portions CM1, CM2, and CM3, a load value is changed by a unit of the first dummy line DML1 or the second to tenth dummy lines electrically connected to each other, and thus, mutual capacitance and/or resistance may be increased in a certain unit. As a result, the external circuit unit may efficiently adjust a load change amount. Further, since the bridge line BR2_3 may be disposed alone at the right side of the third connection portion CM3, the bridge line BR2_3 may be minimized or reduced. Further, even when the display device is enlarged, the plurality of dummy lines may be electrically connected to each other without a process burden.

As described above, according to the display device of exemplary embodiments of the present invention, it is possible to minimize or reduce a change in mutual capacitance of the touch sensor disposed in the trench area.

Further, according to the display device of exemplary embodiments of the present invention, when a short circuit occurs between a sensing line and a dummy line, it is possible to adjust changes in mutual capacitance of the touch sensor through a ground line.

The effects of the exemplary embodiments are not limited by the contents exemplified above, and other various effects are included in the present specification.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A touch sensor, comprising:
a base layer having a sensing area and a non-sensing area disposed adjacent to the sensing area,
wherein the sensing area comprises a first sensing area, a second sensing area protruding from the first sensing area in a first direction in a plan view, and a third sensing area spaced apart from the second sensing area and protruding from the first sensing area in the first direction in the plan view;
a plurality of sensing patterns comprising a first sensing pattern disposed in the first sensing area, a second sensing pattern disposed in the second sensing area, and a third sensing pattern disposed in the third sensing area;
a sensing line disposed in the non-sensing area and electrically connected to the first sensing pattern;
a connection line disposed in the non-sensing area and disposed between the sensing line and the first sensing pattern in the plan view, wherein the connection line electrically connects the second sensing pattern and the third sensing pattern;
a connection portion electrically connecting the sensing line and the first sensing pattern;
a dummy line disposed between the sensing line and the connection line;
a ground line disposed in the non-sensing area, wherein the ground line is configured to receive a ground voltage; and
a bridge line electrically connecting the ground line and the dummy line,
wherein the sensing line is disposed between the ground line and the dummy line in the plan view.

2. The touch sensor of claim 1, further comprising:
an insulating layer,
wherein the dummy line and the ground line are formed of a first conductive layer,
the bridge line is formed of a second conductive layer, and
the insulating layer is disposed between the first conductive layer and the second conductive layer.

3. The touch sensor of claim 2, further comprising:
a contact hole passing through the insulating layer,
wherein the ground line and the dummy line are electrically connected to the bridge line through the contact hole.

4. The touch sensor of claim 2,
wherein the sensing line is formed of the first conductive layer.

5. The touch sensor of claim 2,
wherein the connection portion is formed of the second conductive layer.

6. The touch sensor of claim 5, further comprising:
a contact hole passing through the insulating layer,
wherein the connection portion is electrically connected to the sensing line through the contact hole.

7. The touch sensor of claim 1,
wherein the ground line and the dummy line extend in a second direction crossing the first direction, and the bridge line extends in the first direction.

8. The touch sensor of claim 1,
wherein the bridge line comprises a first bridge line and a second bridge line, and
the first bridge line and the second bridge line are symmetrically disposed relative to the connection portion.

9. The touch sensor of claim 8,
wherein the dummy line comprises a first dummy line and a second dummy line,
the first dummy line is electrically connected to the first bridge line and the second bridge line, and
the second dummy line comprises a first segment and a second segment physically separated from the first segment, wherein the first segment is electrically connected to the first bridge line, and the second segment is electrically connected to the second bridge line.

10. The touch sensor of claim 9,
wherein the first and second dummy lines are integrally formed.

11. The touch sensor of claim 9,
wherein the dummy line further comprises a third dummy line disposed between the connection line and the first sensing pattern.

12. The touch sensor of claim 11,
wherein the bridge line electrically connects the ground line and the first to third dummy lines.

13. The touch sensor of claim 1,
wherein an area of the first sensing area is larger than an area of the second and third sensing areas.

14. The touch sensor of claim 1,
wherein the bridge line comprises a transparent conductive oxide.

15. A display device, comprising:
a display member that displays an image;
a base layer having a sensing area and a non-sensing area disposed adjacent to the sensing area,
wherein the sensing area comprises a first sensing area, a second sensing area protruding from the first sensing area in a first direction in a plan view, and a third sensing area spaced apart from the second sensing area and protruding from the first sensing area in the first direction in the plan view;
a first sensing electrode comprising a plurality of first sensing patterns disposed in the sensing area, wherein the first sensing patterns are arranged in the first direction and are electrically connected to each other;
a second sensing electrode comprising a plurality of second sensing patterns disposed in the first sensing area, wherein the second sensing patterns are arranged in a second direction crossing the first direction and are electrically connected to each other;
a third sensing electrode comprising a first plurality of third sensing patterns disposed in the second sensing area, arranged in the second direction, and electrically connected to each other, and a second plurality of third sensing patterns disposed in the third sensing area, arranged in the second direction, and electrically connected to each other;
a first sensing line electrically connected to one end of the first sensing electrode;
a second sensing line electrically connected to one end of the second sensing electrode;

a connection line electrically connecting the first plurality of third sensing patterns and the second plurality of third sensing patterns, wherein the connection line is disposed between the first sensing line and the first sensing electrode;

a connection portion electrically connecting the first sensing line and the first sensing patterns;

a dummy line disposed between the first sensing line and the connection line;

a ground line disposed in the non-sensing area, wherein the ground line is configured to receive a ground voltage; and a bridge line electrically connecting the ground line and the dummy line, wherein the first sensing line is disposed between the ground line and the dummy line in the plan view.

16. The display device of claim 15, further comprising:
an insulating layer,
wherein the dummy line and the ground line are formed of a first conductive layer,
the bridge line is formed of a second conductive layer, and
the insulating layer is disposed between the first conductive layer and the second conductive layer.

17. The display device of claim 16, further comprising:
a contact hole passing through the insulating layer,
wherein the ground line and the dummy line are electrically connected to the bridge line through the contact hole.

18. The display device of claim 15,
wherein the ground line and the dummy line extend in the second direction, and the bridge line extends in the first direction.

19. The display device of claim 15,
wherein the bridge line comprises a first bridge line and a second bridge line, and
the first bridge line and the second bridge line are symmetrically disposed relative to the connection portion.

20. The display device of claim 19,
wherein the dummy line comprises a first dummy line and a second dummy line,
the first dummy line is electrically connected to the first bridge line and the second bridge line, and
the second dummy line comprises a first segment and a second segment physically separated from the first segment, wherein the first segment is electrically connected to the first bridge line, and the second segment is electrically connected to the second bridge line.

* * * * *